(12) United States Patent
Danilak et al.

(10) Patent No.: US 9,396,104 B1
(45) Date of Patent: Jul. 19, 2016

(54) ACCESSING COMPRESSED DATA OF VARYING-SIZED QUANTA IN NON-VOLATILE MEMORY

(75) Inventors: Radoslav Danilak, Cupertino, CA (US); Ladislav Steffko, San Ramon, CA (US); Rodney Norman Mullendore, San Jose, CA (US)

(73) Assignee: Seagate Technology, LLC, Cupertino, CA (US)

( * ) Notice: Subject to any disclaimer, the term of this patent is extended or adjusted under 35 U.S.C. 154(b) by 21 days.

(21) Appl. No.: 13/053,175

(22) Filed: Mar. 21, 2011

Related U.S. Application Data

(60) Provisional application No. 61/316,373, filed on Mar. 22, 2010.

(51) Int. Cl.
*G06F 12/02* (2006.01)
*G11C 16/10* (2006.01)
*G06F 3/06* (2006.01)

(52) U.S. Cl.
CPC .......... *G06F 12/0246* (2013.01); *G06F 3/0679* (2013.01); *G06F 2212/2022* (2013.01); *G06F 2212/7211* (2013.01); *G11C 16/102* (2013.01)

(58) Field of Classification Search
CPC .............. G06F 12/0246; G06F 3/0679; G06F 2212/2022; G06F 2212/7211; G06F 12/02; G06F 3/06; G11C 16/102; G11C 16/10
USPC ......................................................... 711/103
See application file for complete search history.

(56) References Cited

U.S. PATENT DOCUMENTS

| | | | |
|---|---|---|---|
| 4,028,675 A * | 6/1977 | Frankenberg ................. | 711/106 |
| 5,341,339 A | 8/1994 | Wells | |
| 5,388,083 A | 2/1995 | Assar et al. | |
| 5,392,427 A | 2/1995 | Barrett et al. | |
| 5,404,485 A | 4/1995 | Ban | |
| 5,437,020 A * | 7/1995 | Wells et al. .................. | 714/6.12 |
| 5,479,638 A | 12/1995 | Assar et al. | |
| 5,485,595 A | 1/1996 | Assar et al. | |
| 5,519,843 A * | 5/1996 | Moran et al. .................. | 711/103 |

(Continued)

OTHER PUBLICATIONS

Microsoft, "Compress and Uncompress Files (Zip Files)", Oct. 11, 2009, pp. 1-2, http://web.archive.org/web/20091011070053/http://windows.microsoft.com/en-us/windows-vista/Compress-and-uncompressfiles-zip-files#.*

(Continued)

*Primary Examiner* — Christopher D Birkhimer
(74) *Attorney, Agent, or Firm* — Tayolor English Duma, LLP

(57) ABSTRACT

Accessing data of varying-sized quanta in non-volatile memory provides improved storage efficiency in some situations. For example, a Solid-State Disk (SSD) controller receives (e.g. uncompressed) data from a computing host (e.g. a disk write command), compresses the data, and stores the compressed data into non-volatile (e.g. flash) memory. In response to a subsequent request from the host (e.g. a disk read command), the SSD controller reads and uncompresses the compressed data from the memory. The compressed data is stored in the memory according to varying-sized quanta, due to, e.g., compression algorithm, operating mode, and compression effectiveness on various data. The SSD controller uncompresses the data in part by consulting an included map table to locate header(s) stored in the memory, parsing the header(s) to locate appropriate (compressed) data stored in the memory, and uncompressing the appropriate data from the memory to produce the uncompressed data.

26 Claims, 8 Drawing Sheets

(56) References Cited

U.S. PATENT DOCUMENTS

| | | | |
|---|---|---|---|
| 5,568,423 A | 10/1996 | Jou et al. | |
| 5,634,050 A | 5/1997 | Krueger et al. | |
| 5,787,445 A | 7/1998 | Daberko | |
| 5,822,781 A | 10/1998 | Wells et al. | |
| 5,832,493 A | 11/1998 | Marshall et al. | |
| 5,860,082 A | 1/1999 | Smith et al. | |
| 5,898,868 A | 4/1999 | Krueger et al. | |
| 5,937,425 A | 8/1999 | Ban | |
| 5,963,983 A * | 10/1999 | Sakakura et al. | 711/202 |
| 6,016,275 A | 1/2000 | Han | |
| 6,081,447 A | 6/2000 | Lofgren et al. | |
| 6,256,642 B1 | 7/2001 | Krueger et al. | |
| 6,341,085 B1 | 1/2002 | Yamagami et al. | |
| 6,347,051 B2 | 2/2002 | Yamagami et al. | |
| 6,477,616 B1 * | 11/2002 | Takahashi | 711/111 |
| 6,535,949 B1 | 3/2003 | Parker | |
| 6,594,183 B1 | 7/2003 | Lofgren et al. | |
| 6,671,791 B1 * | 12/2003 | McGrath | 711/206 |
| 6,732,194 B1 * | 5/2004 | Kopylovitz et al. | 710/5 |
| 6,732,221 B2 | 5/2004 | Ban | |
| 6,839,823 B1 * | 1/2005 | See et al. | 711/171 |
| 6,961,839 B2 * | 11/2005 | Allison | G06F 12/1027 711/206 |
| 7,127,550 B1 * | 10/2006 | Lin | 711/103 |
| 7,299,314 B2 * | 11/2007 | Lin et al. | 711/103 |
| 7,386,655 B2 * | 6/2008 | Gorobets et al. | 711/103 |
| 7,441,067 B2 * | 10/2008 | Gorobets et al. | 711/103 |
| 7,469,331 B2 * | 12/2008 | Hepkin | G06F 9/4843 711/202 |
| 7,552,271 B2 * | 6/2009 | Sinclair et al. | 711/103 |
| 7,594,093 B1 * | 9/2009 | Kancherla | G06F 12/0615 711/203 |
| 7,600,075 B2 | 10/2009 | Cousins | |
| 7,904,619 B2 | 3/2011 | Danilak | |
| 7,904,672 B2 | 3/2011 | Danilak | |
| 2003/0149750 A1 * | 8/2003 | Franzenburg | 709/220 |
| 2004/0054858 A1 * | 3/2004 | Chandrasekaran et al. | 711/154 |
| 2004/0153479 A1 * | 8/2004 | Mikesell et al. | 707/200 |
| 2005/0283647 A1 * | 12/2005 | Ishidoshiro et al. | 714/5 |
| 2006/0020738 A1 * | 1/2006 | Hepkin | G06F 12/109 711/1 |
| 2006/0146586 A1 * | 7/2006 | Hirabayashi | 365/51 |
| 2007/0067559 A1 * | 3/2007 | Fujibayashi et al. | 711/112 |
| 2007/0079106 A1 * | 4/2007 | Davis | G06F 12/1018 711/203 |
| 2007/0150694 A1 * | 6/2007 | Chang | G06F 12/0246 711/202 |
| 2007/0271413 A1 * | 11/2007 | Fujibayashi et al. | 711/112 |
| 2007/0271434 A1 * | 11/2007 | Kawamura et al. | 711/165 |
| 2008/0028129 A1 * | 1/2008 | Nakanishi et al. | 711/103 |
| 2008/0068394 A1 * | 3/2008 | Everitt | G06T 1/60 345/582 |
| 2008/0086616 A1 * | 4/2008 | Asano et al. | 711/165 |
| 2008/0106552 A1 * | 5/2008 | Everitt | G06T 11/001 345/552 |
| 2008/0301519 A1 * | 12/2008 | Kawabata | 714/755 |
| 2009/0055623 A1 * | 2/2009 | Hepkin | G06F 12/109 711/203 |
| 2009/0204959 A1 * | 8/2009 | Anand | G06F 9/5027 718/1 |
| 2009/0276601 A1 * | 11/2009 | Kancherla | G06F 12/0615 711/170 |
| 2009/0292522 A1 * | 11/2009 | Maeda | G06F 12/145 703/23 |
| 2010/0287329 A1 * | 11/2010 | Toelkes | G06F 12/0246 711/103 |

OTHER PUBLICATIONS

Webopedia, "Data Compression", Sep. 1, 1996, pp. 1-3, http://web.archive.org/web/20010410062808/http://www.webopedia.com/TERM/D/data_compression.html.*

Webopedia, "Solid State Disk", Jan. 6, 2000, pp. 1-2, http://web.archive.org/web/20020809141838/http://www.webopedia.com/TERM/S/solid_state_disk.html.*

Keun Soo Yim, Hyokyung Bahn, Kern Koh, A Flash Compression Layer for SmartMedia Card Systems, IEEE Transactions on Consumer Electronics, Feb. 2004, p. 192-197, 50-1, IEEE Consumer Electronics Society, UK; 6 pages total.

David A. Maluf, Peter B. Tran, David Tran, Effective Data Representation and Compression in Ground Data Systems, 2008 IEEE Aerospace Conference, Mar. 1-8, 2008, p. 1-7, Intell. Syst. Div., NASA Ames Res. Center, Moffett Field, CA, USA; 7 pages total.

Alan Prosser, Guilherme Cardoso, John Chramowicz, John Marriner, Ryan Rivera, Marcos Turqueti, Distributed Data Acquisition and Storage Architecture for the SuperNova Acceleration Probe, IEEE Transactions on Nuclear Science, Feb. 2008, p. 246-250, 55-1, Fermi Nat. Accel. Lab., Batavia, IL, USA; 6 pages total.

Unpublished document from co-inventor Danilak, accompanying his Nov. 2, 2011 executed inventorship declaration; 1 page.

Lin, W., Shang, Y., Li, Z. "Data Storage Framework on Flash Memory Using Object-based Storage Model" Dept Computer Science and Engineering, Northwest Polytechnic University. IPCSIT vol. 51, Nov. 2012, pp. 708-712 (5 sheets).

Lee, Y., Kim,S., Kim, J., Lee, J,. Park, C., and Maeng, S. "OSSD: A Case for Object-based Solid State Drives" IEEE May 6 2013. 13 sheets.

Schlosser, S., and Iren, S. "Database Storage Management with Object-Based Storage Devices" IRP-TR-05-40. Intel Corporation 2004. 8 sheets.

Kim, J. "OSSD: Object-based Solid State Drive" Workshop on Operating System Technology for NVRAM (NVRAMOS '11), Cheju, Korea, Apr. 18, 2011. pp. 1-32 (32 sheets).

Kang, Y., Yang, J., and Miller, E. "Object-based SCM: An Efficient Interface for Storage Class Memories" Mass Storage Systems and Technologies (MSST), 2011 IEEE 27th Symposium on, May 23-27, 2011. 12 sheets. Print ISBN: 978-1-4577-0427-7.

Lee, J. "Object-based SSD (OSSD): Our Practice and Experience" Flash Solution Team, Memory Division. Samsung Electronics Co. 2010. pp. 1-42 (42 sheets).

Mesnier, M., Ganger, G., and Riedel, E. "Object-Based Storage" IEEE Communication Magazine, Aug. 2003. pp. 84-90 (7 sheets).

Nagle, D., Factor, M. E., Iren, S., Naor, D., Riedel, E., Rodeh, O., and Satran, J. "The ANSI T10 object-based storage standard and current implementations" IBM J. Res. & Dev. vol. 52 No. 4/5 Jul./Sep. 2008 pp. 401-411 (11 sheets).

Factor, M., Meth, K., Naor, D., Rodeh,. O., and Satran, J. "Object Storage: The Future Building Block for Storage Systems" Local to Global Data Interoperability—Challenges and Technologies, Jun. 20-24, 2005, pp. 101-105 (5 sheets).

Kawaguchi, A., Nishioka, S., and Motoda, H. "A Flash-Memory Based Filed System" In Proceedings of the Winter 1995 USENIX Technical Conference, Advanced Research Laboratory, Hitachi, Ltd., 10 sheets.

Gal, E., and Toledo, S. "Algorithms and Data Structures for Flash Memories" ACM Computing Surveys, vol. 37, No. 2, Jun. 2005 pp. 138-163 (26 sheets).

Rajimwale, A., Prabhakaran, V., and Davis, J. "Block Management in Solid-State Devices" In Proceedings of the USENIX Annual Technical Conference, Apr. 21, 2009. 6 sheets.

Lu, Y., Shu, J., Weimin, Z. "Extending the Lifetime of Flash-based Storage through Reducing Write Amplification from File Systems" 11th USENIX Conference on File and Storage Technologies (Fast '13), USENIX Association, Jan. 2013 pp. 257-270 (14 sheets).

Edel, N., Tuteja, D., Miller, E., and Brandt, S. "MRAMFS: A compressing file system for non-volatile RAM" In Proceedings of the 12th International Symposium on Modeling, Analysis, and Simulation of Computer and Telecommunication Systems Storage, 2004. 8 sheets.

Kim, Je., Kim, Jo., Noh, S., Min, S., and Cho, Y. "A Space-Efficient Flash Translation Layer for Compactflash Systems" IEEE Transactions on Consumer Electronics, vol. 48, No. 2, May 2002 pp. 366-375 (10 sheets).

Woodhouse, D. "JFFS: The Journalling Flash File System" Red Hat, Inc, 2001. 12 sheets.

(56) References Cited

OTHER PUBLICATIONS

Carey, M., DeWitt, D., Richardson, J., and Shekita, E. "Storage Management for Objects in EXODUS" Object-Oriented Concepts, Databases, and Applications, chapter 14, ACM Press, 1989. pp. 1-30 (30 sheets).

Desnoyers, P., and Shenoy, P."Hyperion: High Volume Stream Archival for Retrospective Querying" ATC'07 2007 USENIX Annual Technical Conference on Proceedings of the USENIX Annual Technical Conference, Article No. 4., May 29, 2007, pp. 1-14 (14 sheets). ISBN: 999-8888-77-6.

Quinlan, S., and Dorward, S. "Venti: A new approach to archival storage" FAST '02 Proceedings of the 1st USENIX Conference on File and Storage Technologies, Article No. 7. Jan. 28-30, 2002. 13 sheets.

Girouard, F., and Hopkins, A. "EUVE Telemetry Storage and Retrieval" British Interplanetary Society, Journal, vol. 46, No. 9, Sep. 1993. pp. 342-345 (7 sheets).

Groleau, N., Kiser, L., Girouard, F., Hopkins, A., Morgan, T., Chakrabarti, S., Cook, T., Cotton, D., and Dell, P. "A Fully Implemented Semi-Automated Ground-Control System for the Terriers Satellite" Proceedings of the 10th Annual AIAA/USU Small Satellite Conference, Technical Session VI on Mission Operations, 1996, CEA publication No. 767. pp. 1-15 (15 sheets).

Micheloni, R., Marelli, A., and Commodaro, S. "NAND-based systems," Section 2.4, Inside NAND Flash Memories, Springer Science+Business Media B.V. 2010. pp. 38-53 (4 sheets).

Takeuchi, K. "Low power 3D-integrated SSD," Chapter 18, Inside NAND Flash Memories, Springer Science+Business Media B.V. 2010. pp. 515-536 (12 sheets).

Takeuchi, K. "NAND successful as a media for SSD" ISSCC 2008 Tutorial T7. IEEE International Solid-State Circuits Conference, Feb. 2008. 81 sheets.

Park, C., Talawar, P., Won, D., Jung, M., Im, J., Kim, S., and Choi, Y. "A High Performance Controller and NAND Flash-based Solid State Disk (NSSD)" Non-Volatile Semiconductor Memory Workshop, 2006. IEEE NVSMW, Feb. 12-16, 2006. 21st. pp. 17-20 (4 sheets). Print ISBN: 1-4244-0027-9.

Pease, D., Amir, A., Real, L., Biskeborn, B., Richmond, M., and Abe, A. "Linear Tape File System /Long Term File System (LTFS)" 26th IEEE (MSST2010) Symposium on Massive Storage Systems and Technologies and Co-located Events, May 6, 2010. 15 sheets.

"Linear Tape File System (LTFS) Format Specification" version 1.0 released: Apr. 12, 2010. 60 sheets. (see url: http://www-01.ibm.com/support/docview.wss?uid=ssg1S7003166).

Pease, D., Amir, A., Real, L., Biskeborn, B., Richmond, M., and Abe, A. "The Linear Tape File System" 26th IEEE (MSST2010) Symposium on Massive Storage Systems and Technologies and Co-located Events, May 6, 2010. 8 sheets.

\* cited by examiner

ACCESSING COMPRESSED DATA OF VARYING-SIZED QUANTA IN NON-VOLATILE MEMORY

BACKGROUND

1. Field

Advancements in accessing of non-volatile (e.g. flash) memory are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, including as a process, an article of manufacture, an apparatus, a system, a composition of matter, and a computer readable medium such as a computer readable storage medium (e.g. media in an optical and/or magnetic mass storage device such as a disk, or an integrated circuit having non-volatile storage such as flash storage) or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

DETAILED DESCRIPTION

Figure 1A:
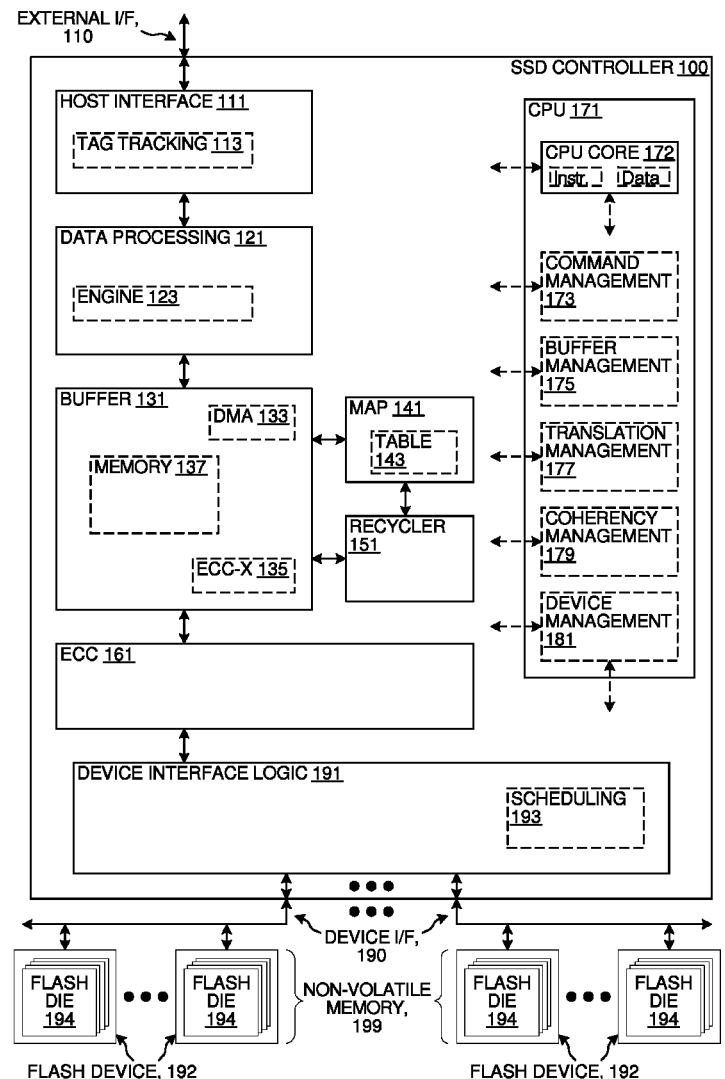
FIG. 1A illustrates selected details of an embodiment of a Solid-State Disk (SSD) including an SSD controller using variable mapping for accessing and controlling non-volatile memories.

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

ACRONYMS

Elsewhere herein various shorthand abbreviations, or acronyms, refer to certain elements. The descriptions of at least some of the acronyms follow.

| Acronym | Description |
| --- | --- |
| ASCII | American Standard Code for Information Interchange |
| BCH | Bose Chaudhuri Hocquenghem |
| BER | Bit Error Rate |
| CD | Compact Disk |
| CF | Compact Flash |
| CMOS | Complementary Metal Oxide Semiconductor |
| CPU | Central Processing Unit |
| CRC | Cyclic Redundancy Check |
| DDR | Double-Data-Rate |
| DMA | Direct Memory Access |
| DVD | Digital Versatile/Video Disk |
| ECC | Error-Correcting Code |
| eSATA | external Serial Advanced Technology Attachment |
| HDD | Hard Disk Drive |
| IC | Integrated Circuit |
| IDE | Integrated Drive Electronics |
| JPEG | Joint Photographic Experts Group |
| LBA | Logical Block Address |
| LDPC | Low-Density Parity-Check |
| LPN | Logical Page Number |
| MLC | Multi-Level Cell |
| MMC | MultiMediaCard |
| MPEG | Moving Picture Experts Group |
| NCQ | Native Command Queuing |
| ONFI | Open NAND Flash Interface |
| PC | Personal Computer |
| PCIe | Peripheral Component Interconnect express (PCI express) |
| PDA | Personal Digital Assistant |
| RAID | Redundant Array of Inexpensive/Independent Disks |
| RS | Reed-Solomon |
| SAS | Serial Attached Small Computer System Interface (Serial SCSI) |
| SATA | Serial Advanced Technology Attachment (Serial ATA) |
| SCSI | Small Computer System Interface |
| SD | Secure Digital |
| SLC | Single-Level Cell |
| SMART | Self-Monitoring Analysis and Reporting Technology |
| SSD | Solid-State Disk/Drive |
| USB | Universal Serial Bus |

Accessing processed (e.g. compressed) data of varying-sized quanta in non-volatile memory provides improved storage efficiency in some usage scenarios. For example, a Solid-State Disk (SSD) controller receives (uncompressed) data from a computing host (e.g. relating to a disk write command), compresses the data, and stores the compressed data into flash memory. In response to a subsequent request from the computing host (e.g. relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host. The SSD controller includes a host interface for interfacing with the computing host, a flash interface for interfacing with the flash memory, and circuitry for controlling the interfaces and performing (and/or controlling various aspects of the performing) the compressing and the uncompressing.

According to various embodiments, the host interface is compatible with one or more of a USB interface standard, a CF interface standard, an MMC interface standard, an SD interface standard, a Memory Stick interface standard, an xD-picture card interface standard, an IDE interface standard, a SATA interface standard, a SCSI interface standard, a SAS interface standard, and a PCIe interface standard. According to various embodiments, the computing host is all or any portion of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game. In some embodiments, an interfacing host (such as an SAS/SATA bridge) operates as a computing host.

Some types of SSDs use flash memory to provide non-volatile storage (e.g., the flash memory retains information without application of power). Some SSDs are compatible with form-factors, electrical interfaces, and/or protocols used by magnetic and/or optical non-volatile storage, such as HDDs, CD drives, and DVD drives.

EXAMPLE EMBODIMENTS

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims.

EC1

A system comprising:
a means for communicating host data with a computing host;
a means for communicating flash data with a flash memory;
a means for transforming between the host data and the flash data; and wherein at least a portion of the flash data is compressed with respect to a corresponding portion of the host data.

EC2

The system of EC1, wherein the means for transforming comprises a means for compressing at least a portion of the host data to produce the corresponding portion of the flash data and wherein the means for transforming further comprises a means for uncompressing the corresponding portion of the flash data to produce the corresponding portion of the host data.

EC3

The system of EC2, wherein the host data is a number of host-access-quanta in length, the number specified by a write command from the computing host.

EC4

The system of EC3, wherein each of the host-access-quanta corresponds to a respective storage location identified by a respective Logical Block Address (LBA).

EC5

The system of EC2, wherein the corresponding portion of the flash data is a number of host-access-quanta in length, the quanta specified by a read command from the computing host.

EC6

The system of EC5, wherein each of the host-access-quanta corresponds to a respective storage location identified by a respective Logical Block Address (LBA).

EC7

The system of EC1, wherein the host data comprises one or more of American Standard Code for Information Interchange (ASCII) text data, Joint Photographic Experts Group (JPEG) image data, Moving Picture Experts Group (MPEG) media data, and executable binary data.

EC8

The system of EC1, wherein the means for transforming comprises a means for compressing at least a portion of the host data to produce at least a corresponding portion of the flash data.

EC9

The system of EC8, wherein the means for compressing comprises a means for determining that compressibility of the at least a portion of the host data is below a threshold and for providing a copy of the at least portion of the host data as the at least a corresponding portion of the flash data.

EC10

The system of EC1, wherein the means for transforming comprises a means for uncompressing at least a portion of the flash data to produce at least a corresponding portion of the host data.

EC11

The system of EC10, wherein the means for uncompressing comprises a means for examining a flag in a header associated with all or any portion of the flash data.

EC12

The system of EC1, wherein the means for transforming comprises a means for accessing a mapping table to determine a number of locations to access in the flash memory.

EC13

The system of EC12, wherein the number of locations is specified as a number of units of data in the flash memory, each of the units of data comprising a data portion and an associated ECC portion.

EC14

The system of EC1, wherein the means for transforming comprises a means for accessing a mapping table to determine location(s) to access in the flash memory.

EC15

The system of EC14, wherein at least one of the location(s) to access in the flash memory comprises a starting location in the flash memory and a length.

EC16

The system of EC15, wherein the length is specified as a number of units of data in the flash memory, each of the units of data comprising a data portion and an associated ECC portion.

EC17

The system of EC15, wherein the starting location and the length collectively identify a region of the flash memory comprising first and second flash pages of the flash memory.

EC18

The system of EC15, wherein the starting location and the length collectively identify a region of the flash memory comprising first and second flash devices of the flash memory.

EC19

The system of EC14, wherein the means for transforming further comprises a means for parsing header(s) obtained from the location(s) in the flash memory to determine an offset to uncompress data from the flash memory.

EC20

The system of EC1, wherein the means are collectively implemented in a single Integrated Circuit (IC).

EC21

The system of EC1, wherein the means are comprised in a Solid-State Disk (SSD).

EC22

The system of EC1, wherein the means for communicating host data with the computing host is compatible with a storage interface standard.

EC23

The system of EC22, wherein the storage interface standard comprises one or more of
  a Universal Serial Bus (USB) interface standard,
  a Compact Flash (CF) interface standard,
  a MultiMediaCard (MMC) interface standard,
  a Secure Digital (SD) interface standard,
  a Memory Stick interface standard,
  an xD-picture card interface standard,
  an Integrated Drive Electronics (IDE) interface standard,
  a Serial Advanced Technology Attachment (SATA) interface standard,
  an external SATA (eSATA) interface standard,
  a Small Computer System Interface (SCSI) interface standard,
  a Serial Attached Small Computer System Interface (SAS) interface standard,
  a Fibre Channel interface standard,
  an Ethernet interface standard, and
  a Peripheral Component Interconnect express (PCIe) interface standard.

EC24

The system of EC1, further comprising all or any portion of the computing host.

EC25

The system of EC24, wherein the computing host comprises one or more of
a computer,
a workstation computer,
a server computer,
a storage server,
a Personal Computer (PC),
a laptop computer,
a notebook computer,
a netbook computer,
a Personal Digital Assistant (PDA),
a media player,
a media recorder,
a digital camera,
a cellular handset,
a cordless telephone handset, and
an electronic game.

EC26

The system of EC1, further comprising all or any portion of the flash memory.

EC27

A system comprising:
a host interface enabled to couple to a computing host;
a flash memory interface enabled to couple to one or more flash memories;
a controller coupled to the host interface and the flash memory interface; and
wherein the controller is enabled to
communicate host data with the host via the host interface,
communicate flash data with the flash memories via the flash memory interface,
transform between the host data and the flash data, and
wherein at least a portion of the flash data is compressed with respect to a corresponding portion of the host data.

EC28

The system of EC27, wherein the controller is further enabled to compress at least a portion of the host data to produce the corresponding portion of the flash data and the controller is further enabled to uncompress the corresponding portion of the flash data to produce the corresponding portion of the host data.

EC29

The system of EC28, wherein the host data is a number of host-access-quanta in length, the number specified by a write command from the computing host.

EC30

The system of EC29, wherein each of the host-access-quanta corresponds to a respective storage location identified by a respective Logical Block Address (LBA).

EC31

The system of EC28, wherein the corresponding portion of the flash data is a number of host-access-quanta in length, the quanta specified by a read command from the computing host.

EC32

The system of EC31, wherein each of the host-access-quanta corresponds to a respective storage location identified by a respective Logical Block Address (LBA).

EC33

The system of EC27, wherein the host data comprises one or more of American Standard Code for Information Interchange (ASCII) text data, Joint Photographic Experts Group (JPEG) image data, Moving Picture Experts Group (MPEG) media data, and executable binary data.

EC34

The system of EC27, wherein:
the controller comprises a mapping table enabled to store a plurality of mappings between addresses provided from the host via the host interface and corresponding locations in the flash memories; and
the transformation between the host data and the flash data comprises referencing the mapping table with a particular one of the addresses provided from the host to determine a corresponding particular one of the locations in the flash memories to access.

EC35

The system of EC34, wherein the transformation between the host data and the flash data further comprises:
directing the flash memory interface to read one or more of the flash memories in accordance with the particular location to obtain flash memory read data;
determining an offset in the flash memory read data based at least in part on the flash memory read data;
uncompressing the flash memory read data beginning at the offset.

EC36

The system of EC35, wherein an amount of data read from the one or more flash memories is determined by referencing the mapping table with the particular address.

EC37

The system of EC35, wherein the transformation between the host data and the flash data further comprises correcting zero or more errors in the flash memory read data before the determining the offset and before the uncompressing.

EC38

The system of EC35, wherein the determining the offset comprises:

parsing one or more headers obtained from the flash memory read data;
selecting a particular one of the headers based at least in part on at least a portion of the particular host address; and
computing the offset based at least in part on the particular header.

EC39

The system of EC27, wherein:
the communication of the host data comprises providing the host data to the host via the host interface;
the communication of the flash data comprises receiving the flash data from one or more of the flash memories via the flash memory interface; and
the transformation between the host data and the flash data comprises uncompressing all or any portion of the flash data to produce the host data.

EC40

The system of EC27, wherein:
the communication of the host data comprises receiving the host data from the host via the host interface;
the communication of the flash data comprises providing the flash data to the flash memories via the flash memory interface; and
the transformation between the host data and the flash data comprises compressing the host data to produce at least a portion of the flash data.

EC41

The system of EC40, wherein the controller is further enabled to direct the flash memory interface to perform a write of all or any portion of the flash data to any one of the flash memories.

EC42

The system of EC40, wherein the controller is further enabled to buffer all or any portion of the flash data and to direct the flash memory interface to perform a write of all or any portion of the buffered flash data to any one of the flash memories.

EC43

The system of EC27, wherein:
the communication of the host data comprises receiving a command from the host via the host interface, the command comprising an address to access the host data; and
the transformation between the host data and the flash data comprises determining a location of the flash data based at least in part on the address and with respect to the flash memories.

EC44

The system of EC43, wherein the command is one or more of a read command and a write command.

EC45

The system of EC43, wherein the address is a Logical Block Address (LBA).

EC46

The system of EC43, wherein the location comprises one or more of
an identification of a particular one of the flash memories to access with respect to the flash data,
an identification of a particular one of a plurality of busses to use to access the flash data, the flash memory interface being enabled to interface to the flash memories via the busses,
an identification of a particular page of the flash memories to access with respect to the flash data, and
an offset within a particular page of the flash memories to access with respect to the flash data.

EC47

The system of EC43, wherein the command is in accordance with one of a plurality of host-access-quanta, and the determination of the location is in accordance with any of the host-access-quanta.

EC48

The system of EC47, wherein the computing host is one of a first computing host operating according to a first one of the host-access-quanta and a second computing host operating according to a second one of the host-access-quanta, and the first and the second host-access-quanta are different.

EC49

The system of EC47, wherein the plurality of host-access-quanta comprise two or more of
a 512-byte access quanta,
a 516-byte access quanta,
a 520-byte access quanta,
a 524-byte access quanta,
a 528-byte access quanta,
a 532-byte access quanta,
a 536-byte access quanta,
a 540-byte access quanta,
a 1024-byte access quanta,
a 1032-byte access quanta,
a 2048-byte access quanta,
a 2056-byte access quanta,
a 4096-byte access quanta,
a 4100-byte access quanta,
a 4104-byte access quanta,
a 4108-byte access quanta,
a 4112-byte access quanta,
a 4116-byte access quanta,
a 4160-byte access quanta,
a 4164-byte access quanta,
a 4172-byte access quanta,
a 4192-byte access quanta,
a 4196-byte access quanta,
a 4204-byte access quanta,
a 4224-byte access quanta,
a 4228-byte access quanta,
a 4236-byte access quanta, and
a 4256-byte access quanta.

EC50

The system of EC47, wherein the command comprises an access size as an integer number of the host-access-quanta.

EC51

The system of EC43, wherein the communication of the flash data is in accordance with one of a plurality of flash-access-quanta, and the determination of the location is in accordance with any of the flash-access-quanta.

EC52

The system of EC27, wherein the host interface is compatible with a storage interface standard.

EC53

The system of EC52, wherein the storage interface standard comprises one or more of
- a Universal Serial Bus (USB) interface standard,
- a Compact Flash (CF) interface standard,
- a MultiMediaCard (MMC) interface standard,
- a Secure Digital (SD) interface standard,
- a Memory Stick interface standard,
- an xD-picture card interface standard,
- an Integrated Drive Electronics (IDE) interface standard,
- a Serial Advanced Technology Attachment (SATA) interface standard,
- an external SATA (eSATA) interface standard,
- a Small Computer System Interface (SCSI) interface standard,
- a Serial Attached Small Computer System Interface (SAS) interface standard,
- a Fibre Channel interface standard,
- an Ethernet interface standard, and
- a Peripheral Component Interconnect express (PCIe) interface standard.

EC54

The system of EC27, further comprising all or any portion of the computing host.

EC55

The system of EC54, wherein the computing host comprises one or more of
- a computer,
- a workstation computer,
- a server computer,
- a storage server,
- a Personal Computer (PC),
- a laptop computer,
- a notebook computer,
- a netbook computer,
- a Personal Digital Assistant (PDA),
- a media player,
- a media recorder,
- a digital camera,
- a cellular handset,
- a cordless telephone handset, and
- an electronic game.

EC56

The system of EC27, wherein the flash memory interface is compatible with one or more of
- an Open NAND Flash Interface (ONFI),
- a Toggle-mode interface,
- a Dual Data Rate (DDR) synchronous interface,
- a synchronous interface, and
- an asynchronous interface.

EC57

The system of EC27, further comprising at least one of the flash memories.

EC58

The system of EC57, wherein the at least one flash memory comprises one or more of
- NAND flash technology storage cells, and
- NOR flash technology storage cells.

EC59

A method comprising:
communicating host data with a computing host;
communicating flash data with a flash memory;
transforming between the host data and the flash data; and
wherein at least a portion of the flash data is compressed with respect to a corresponding portion of the host data.

EC60

The method of EC59, wherein the transforming comprises compressing at least a portion of the host data to produce the corresponding portion of the flash data and wherein the transforming further comprises uncompressing the corresponding portion of the flash data to produce the corresponding portion of the host data.

EC61

The method of EC60, wherein the host data is a number of host-access-quanta in length, the number specified by a write command from the computing host.

EC62

The method of EC61, wherein each of the host-access-quanta corresponds to a respective storage location identified by a respective Logical Block Address (LBA).

EC63

The method of EC60, wherein the corresponding portion of the flash data is a number of host-access-quanta in length, the quanta specified by a read command from the computing host.

EC64

The method of EC63, wherein each of the host-access-quanta corresponds to a respective storage location identified by a respective Logical Block Address (LBA).

EC65

The method of EC59, wherein the transforming comprises accessing a mapping table to determine location(s) to access in the flash memory.

EC66

The method of EC59, wherein the transforming comprises parsing header(s) obtained from location(s) in the flash memory to determine an offset to uncompress data from the flash memory.

EC67

The method of EC59, wherein the communicating host data with the computing host is in accordance with one or more of
- a Universal Serial Bus (USB) interface standard,
- a Compact Flash (CF) interface standard,
- a MultiMediaCard (MMC) interface standard,
- a Secure Digital (SD) interface standard,
- a Memory Stick interface standard,
- an xD-picture card interface standard,
- an Integrated Drive Electronics (IDE) interface standard,
- a Serial Advanced Technology Attachment (SATA) interface standard,
- an external SATA (eSATA) interface standard,
- a Small Computer System Interface (SCSI) interface standard,
- a Serial Attached Small Computer System Interface (SAS) interface standard,
- a Fibre Channel interface standard,
- an Ethernet interface standard, and
- a Peripheral Component Interconnect express (PCIe) interface standard.

EC68

The method of EC59, wherein the computing host comprises one or more of
- a computer,
- a workstation computer,
- a server computer,
- a storage server,
- a Personal Computer (PC),
- a laptop computer,
- a notebook computer,
- a netbook computer,
- a Personal Digital Assistant (PDA),
- a media player,
- a media recorder,
- a digital camera,
- a cellular handset,
- a cordless telephone handset, and
- an electronic game.

EC69

A computer readable medium having a set of instructions stored therein that when executed by a processing element cause the processing element to perform operations comprising:
  managing a host interface to communicate host data with a computing host;
  managing a flash interface to communicate flash data with a flash memory;
  managing transforming between the host data and the flash data; and
  wherein at least a portion of the flash data is compressed with respect to a corresponding portion of the host data.

EC70

The computer readable medium of EC69, wherein the transforming comprises compressing at least a portion of the host data to produce the corresponding portion of the flash data and wherein the transforming further comprises uncompressing the corresponding portion of the flash data to produce the corresponding portion of the host data.

EC71

The computer readable medium of EC70, wherein the host data is a number of host-access-quanta in length, the number specified by a write command from the computing host.

EC72

The computer readable medium of EC71, wherein each of the host-access-quanta corresponds to a respective storage location identified by a respective Logical Block Address (LBA).

EC73

The computer readable medium of EC70, wherein the corresponding portion of the flash data is a number of host-access-quanta in length, the quanta specified by a read command from the computing host.

EC74

The computer readable medium of EC73, wherein each of the host-access-quanta corresponds to a respective storage location identified by a respective Logical Block Address (LBA).

EC75

The computer readable medium of EC69, wherein the transforming comprises accessing a mapping table to determine location(s) to access in the flash memory.

EC76

The computer readable medium of EC69, wherein the transforming comprises parsing header(s) obtained from location(s) in the flash memory to determine an offset to uncompress data from the flash memory.

EC77

The computer readable medium of EC69, wherein the host interface is in accordance with one or more of
- a Universal Serial Bus (USB) interface standard,
- a Compact Flash (CF) interface standard,
- a MultiMediaCard (MMC) interface standard,
- a Secure Digital (SD) interface standard,
- a Memory Stick interface standard,
- an xD-picture card interface standard,
- an Integrated Drive Electronics (IDE) interface standard,
- a Serial Advanced Technology Attachment (SATA) interface standard,
- an external SATA (eSATA) interface standard,
- a Small Computer System Interface (SCSI) interface standard,
- a Serial Attached Small Computer System Interface (SAS) interface standard,
- a Fibre Channel interface standard,
- an Ethernet interface standard, and
- a Peripheral Component Interconnect express (PCIe) interface standard.

EC78

The computer readable medium of EC69, wherein the computing host comprises one or more of a computer,
a workstation computer,
a server computer,
a storage server,
a Personal Computer (PC),
a laptop computer,
a notebook computer,
a netbook computer,
a Personal Digital Assistant (PDA),
a media player,
a media recorder,
a digital camera,
a cellular handset,
a cordless telephone handset, and
an electronic game.

EC79

A system comprising:
a means for communicating host data with a computing host;
a means for communicating flash data with a flash memory;
a means for transforming between the host data and the flash data; and
wherein the means for transforming comprises a means for accessing a mapping table to determine a number of locations to access in the flash memory with respect to the flash data that corresponds to the host data.

EC80

The system of EC79, wherein the number of locations is specified as a number of units of data in the flash memory, each of the units of data comprising a data portion and an associated ECC portion.

EC81

A system comprising:
a host interface enabled to couple to a computing host;
a flash memory interface enabled to couple to one or more flash memories;
a controller coupled to the host interface and the flash memory interface; and
wherein the controller is enabled to
 communicate host data with the computing host via the host interface,
 communicate flash data with the flash memories via the flash memory interface,
 transform between the host data and the flash data, and
 wherein the transform comprises an access of a mapping table to determine a number of locations to access in the flash memories with respect to the flash data that corresponds to the host data.

EC82

The system of EC81, wherein the number of locations is specified as a number of units of data in the flash memory, each of the units of data comprising a data portion and an associated ECC portion.

EC83

A method comprising:
communicating host data with a computing host;
communicating flash data with a flash memory;
transforming between the host data and the flash data; and
wherein the transforming comprises accessing a mapping table to determine a number of locations to access in the flash memory with respect to the flash data that corresponds to the host data.

EC84

The method of EC83, wherein the number of locations is specified as a number of units of data in the flash memory, each of the units of data comprising a data portion and an associated ECC portion.

EC85

A system comprising:
a means for communicating host data with a computing host;
a means for communicating flash data with a flash memory;
a means for transforming between the host data and the flash data; and
wherein the means for transforming comprises a means for accessing a mapping table to determine location(s) to access in the flash memory with respect to the flash data that corresponds to the host data.

EC86

The system of EC85, wherein at least one of the location(s) to access in the flash memory comprises a starting location in the flash memory and a length.

EC87

The system of EC86, wherein the length is specified as a number of units of data in the flash memory, each of the units of data comprising a data portion and an associated ECC portion.

EC88

The system of EC86, wherein the starting location and the length collectively identify a region of the flash memory comprising first and second flash pages of the flash memory.

EC89

The system of EC86, wherein the starting location and the length collectively identify a region of the flash memory comprising first and second flash devices of the flash memory.

EC90

The system of EC85, wherein the means for transforming further comprises a means for parsing header(s) obtained from the location(s) in the flash memory to determine an offset to access data from the flash memory.

EC91

The system of EC85, wherein the transforming is based at least in part on a command from the computing host that is in accordance with one of a plurality of host-access-quanta, and the determination of the location is in accordance with any of the host-access-quanta.

EC92

The system of EC91, wherein the host-access-quanta comprise two or more of a 512-byte access quanta,
a 516-byte access quanta,
a 520-byte access quanta,
a 524-byte access quanta,
a 528-byte access quanta,
a 532-byte access quanta,
a 536-byte access quanta,
a 540-byte access quanta,
a 1024-byte access quanta,
a 1032-byte access quanta,
a 2048-byte access quanta,
a 2056-byte access quanta,
a 4096-byte access quanta,
a 4100-byte access quanta,
a 4104-byte access quanta,
a 4108-byte access quanta,
a 4112-byte access quanta,
a 4116-byte access quanta,
a 4160-byte access quanta,
a 4164-byte access quanta,
a 4172-byte access quanta,
a 4192-byte access quanta,
a 4196-byte access quanta,
a 4204-byte access quanta,
a 4224-byte access quanta,
a 4228-byte access quanta,
a 4236-byte access quanta, and
a 4256-byte access quanta.

EC93

The system of EC91, wherein the command comprises an access size as an integer number of the host-access-quanta.

EC94

The system of EC85, wherein the communication of the flash data is in accordance with one of a plurality of flash-access-quanta, and the determination of the location is in accordance with any of the flash-access-quanta.

EC95

The system of EC79 or EC85, wherein the means are collectively implemented in a single Integrated Circuit (IC).

EC96

The system of EC79 or EC85, wherein the means are comprised in a Solid-State Disk (SSD).

EC97

A method comprising:
receiving by a controller and from a host a logical block address comprising a Logical Page Number (LPN);
mapping, by the controller, the LPN to a variable-sized-unit specifier comprising an ECC unit address and an ECC unit length, the variable-sized-unit specifier associated with a portion of a non-volatile memory of a size corresponding to the ECC unit length;
reading the portion of the non-volatile memory to obtain read data comprising a first ECC unit;
parsing one or more headers in the first ECC unit;
selecting a particular one of the headers associated with the LPN;
determining an offset in the first ECC unit based on information in the particular header; uncompressing the read data starting at the offset in the first ECC unit to produce uncompressed data; and
returning at least a portion of the uncompressed data in response to the receiving.

EC98

The method of EC97,
wherein the logical block address is a first logical block address; and
wherein the portion of the non-volatile memory comprises data associated with a second logical block address not equal to the first logical block address.

EC99

The method of EC97,
wherein the logical block address further comprises a logical offset; and
wherein the at least a portion of the uncompressed data is a portion less than all of the uncompressed data according to the logical offset.

System

FIG. 1A illustrates selected details of an embodiment of an SSD including an SSD controller using variable mapping for accessing and controlling non-volatile memories. SSD controller 100 is communicatively coupled via one or more external interfaces 110 to a host (not illustrated). According to various embodiments, external interfaces 110 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD controller 100 includes a SATA interface and a PCIe interface.

SSD controller 100 is further communicatively coupled via one or more device interfaces 190 to non-volatile memory 199 including one or more storage devices, such as flash devices 192. According to various embodiments, device interfaces 190 are one or more of: an asynchronous interface; a synchronous interface; a DDR synchronous interface; an ONFI compatible interface, such as an ONFI 2.2 compatible interface; a Toggle-mode compatible flash interface; a non-standard version of any of the preceding interfaces; a custom interface; or any other type of interface used to connect to storage devices.

Flash devices 192 have, in some embodiments, one or more individual flash die 194. According to type of a particular one of flash devices 192, a plurality of flash die 194 in the particular flash device 192 are optionally and/or selectively accessible in parallel. Flash devices 192 are merely representative of one type of storage device enabled to communicatively couple to SSD controller 100. In various embodiments, any type of storage device is usable, such as an SLC NAND flash memory, MLC NAND flash memory, NOR flash memory, read-only memory, static random access memory, dynamic random access memory, ferromagnetic memory, phase-change memory, racetrack memory, or any other type of memory device or storage medium.

According to various embodiments, device interfaces 190 are organized as: one or more busses with one or more flash devices 192 per bus; one or more groups of busses with one or more flash devices 192 per bus, where busses in a group are generally accessed in parallel; or any other organization of flash devices 192 onto device interfaces 190.

Continuing in FIG. 1A, SSD controller 100 has one or more modules, such as host interface 111, data processing 121, buffer 131, map 141, recycler 151, ECC 161, device interface logic 191, and CPU 171. The specific modules and interconnections illustrated in FIG. 1A are merely representative of one embodiment, and many arrangements and interconnections of some or all of the modules, as well as additional modules not illustrated, are conceived. In a first example, in some embodiments, there are two or more host interfaces 111 to provide dual-porting. In a second example, in some embodiments, data processing 121 and/or ECC 161 are combined with buffer 131. In a third example, in some embodiments, host interfaces 111 is directly coupled to buffer 131, and data processing 121 optionally and/or selectively operates on data stored in buffer 131. In a fourth example, in some embodiments, device interface logic 191 is directly coupled to buffer 131, and ECC 161 optionally and/or selectively operates on data stored in buffer 131.

Host interface 111 sends and receives commands and/or data via external interface 110, and, in some embodiments, tracks progress of individual commands via tag tracking 113. For example, the commands include a read command specifying an address (such as an LBA) and an amount of data (such as a number of LBA quanta, e.g. sectors) to read; in response the SSD provides read status and/or read data. For another example, the commands include a write command specifying an address (such as an LBA) and an amount of data (such as a number of LBA quanta, e.g. sectors) to write; in response the SSD provides write status and/or requests write data and optionally subsequently provides write status. In some embodiments, host interface 111 is compatible with a SATA protocol and, using NCQ commands, is enabled to have up to 32 pending commands, each with a unique tag represented as a number from 0 to 31. In some embodiments, tag tracking 113 is enabled to associate an external tag for a command received via external interface 110 with an internal tag used to track the command during processing by SSD controller 100.

According to various embodiments, one or more of: data processing 121 optionally and/or selectively processes some or all data sent between buffer 131 and external interfaces 110; and data processing 121 optionally and/or selectively processes data stored in buffer 131. In some embodiments, data processing 121 uses one or more engines 123 to perform one or more of: encrypting; decrypting; compressing; decompressing; formatting; reformatting; transcoding; and any other data processing and/or manipulation task.

Buffer 131 stores data sent to/from external interfaces 110 from/to device interfaces 190. In some embodiments, buffer 131 additionally stores system data, such as some or all map tables, used by SSD controller 100 to manage flash devices 192. In various embodiments, buffer 131 has one or more of: memory 137 used for temporary storage of data; DMA 133 used to control movement of data to and/or from buffer 131; ECC-X 135 used to provide a higher-level error correction function; and other data movement and/or manipulation functions. An example of a higher-level error correction function is a RAID-like capability, where redundancy is at a flash device (e.g. multiple ones of flash devices 192) level and/or a flash die (e.g. flash die 194) level instead of at a disk level.

According to various embodiments, one or more of: ECC 161 optionally and/or selectively processes some or all data sent between buffer 131 and device interfaces 190; and ECC 161 optionally and/or selectively processes data stored in buffer 131. In some embodiments, ECC 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding.

Device interface logic 191 controls flash devices 192 via device interfaces 190. Device interface logic 191 is enabled to send data to/from flash devices 192 according to a protocol of flash devices 192. Device interface logic 191 includes scheduling 193 to selectively sequence control of flash devices 192 via device interfaces 190. For example, in some embodiments, scheduling 193 is enabled to queue operations to flash devices 192, and to selectively send the operations to individual ones of flash devices 192 (or flash die 194) as individual flash devices 192 (or flash die 194) are available.

Map 141 converts between data addressing used on external interfaces 110 and data addressing used on device interfaces 190, using table 143 to map external data addresses to locations in non-volatile memory 199. For example, in some embodiments, map 141 converts LBAs used on external interfaces 110 to block and/or page addresses targeting one or more flash die 194, via mapping provided by table 143. In some embodiments, a granularity of map 141 is fixed, such as mapping first fixed-sized logical blocks used on external interfaces 110 to second fixed-sized blocks used on device interfaces 190. In other embodiments, a granularity of map 141 is variable and not all blocks used on either external interfaces 110 or device interfaces 190 are necessarily a same size.

In some embodiments, table 143 associates logical page addresses with a respective map entry, where the logical page addresses is a portion of and/or is derived from the LBA, and the map entry identifies a portion of the non-volatile memory. For example, in some embodiments, the logical page address is a higher-order portion of the LBA, and a lower-order portion of the LBA is an offset within a logical page specified by the logical page address.

In some embodiments, the map entry identifies the portion of the non-volatile memory as a base address, such as a read unit address, and a length, such as a number of read units. In some embodiments, the read units are sequential in locations in an address space of the non-volatile memory. In further embodiments, the read units are striped across a plurality of flash die (such as flash die 194) and/or flash devices (such as flash devices 192).

In some embodiments, map 141 uses table 143 to perform and/or to look up translations between addresses used on external interfaces 110 and data addressing used on device interfaces 190. According to various embodiments, table 143 is one or more of: a one-level map; a two-level map; a multi-level map; a map cache; a compressed map; any type of mapping from one address space to another; and any combination of the foregoing. According to various embodiments, table 143 includes one or more of: static random access memory; dynamic random access memory; non-volatile memory (such as flash memory); cache memory; on-chip memory; off-chip memory; and any combination of the foregoing.

In some embodiments, recycler 151 performs garbage collection. For example, in some embodiments, flash devices 192 contain blocks that must be erased before the blocks are re-writeable. Recycler 151 is enabled to determine which portions of flash devices 192 are actively in use, such as by scanning a map maintained by map 141, and to make unused portions of flash devices 192 available for writing by erasing them. In further embodiments, recycler 151 is enabled to move data stored within flash devices 192 to make larger contiguous portions of flash devices 192 available for writing.

CPU 171 controls various portions of SSD controller 100. CPU 171 includes CPU core 172. CPU core 172 is, according to various embodiments, one or more single-core or multi-core processors. The individual processors cores in CPU core 172 are, in some embodiments, multi-threaded. CPU core 172 includes instruction and/or data caches and/or memories. For example, the instruction memory contains instructions to enable CPU core 172 to execute software (sometimes called firmware) to control SSD controller 100. In some embodiments, some or all of the firmware executed by CPU core 172 is stored on flash devices 192.

In various embodiments, CPU 171 further includes: command management 173 to track and control commands received via external interfaces 110 while the commands are in progress; buffer management 175 to control allocation and use of buffer 131; translation management 177 to control map 141; coherency management 179 to control consistency of data addressing and to avoid conflicts such as between external data accesses and recycle data accesses; device management 181 to control device interface logic 191; and optionally other management units. None, any, or all of the management functions performed by CPU 171 are, according to various embodiments, controlled and/or managed by hardware, by software (such as software executing on CPU core 172 or on a host connected via external interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD controller 100 and is compatible with operation with various computing hosts, such as via adaptation of host interface 111 and/or external interface 110. The various computing hosts include one or any combination of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game.

In various embodiments, all or any portion of an SSD controller (or a computing-host flash memory controller) are implemented on a single IC, a single die of a multi-die IC, a plurality of dice of a multi-die IC, or a plurality of ICs. For example, buffer 131 is implemented on a same die as other elements of SSD controller 100. For another example, buffer 131 is implemented on a different die than other elements of SSD controller 100.

Figure 1B:
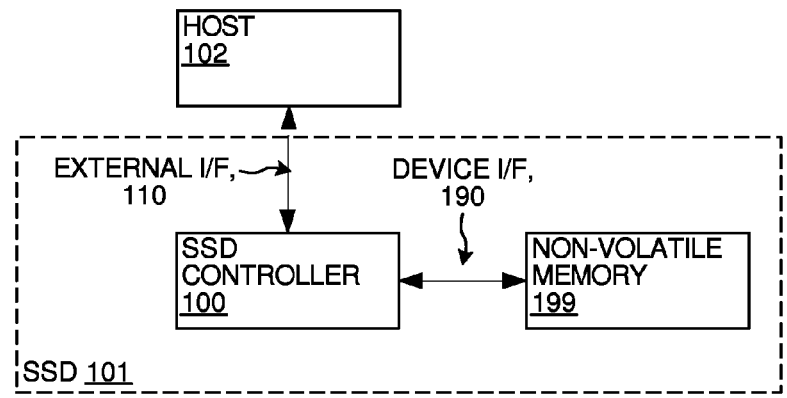
FIG. 1B illustrates selected details of an embodiment of a system including the SSD of FIG. 1A.

FIG. 1B illustrates selected details of an embodiment of a system including the SSD of FIG. 1A. SSD 101 includes SSD controller 100 coupled to non-volatile memory 199 via device interfaces 190. The SSD is coupled to host 102 via external interfaces 110.

Figure 1C:
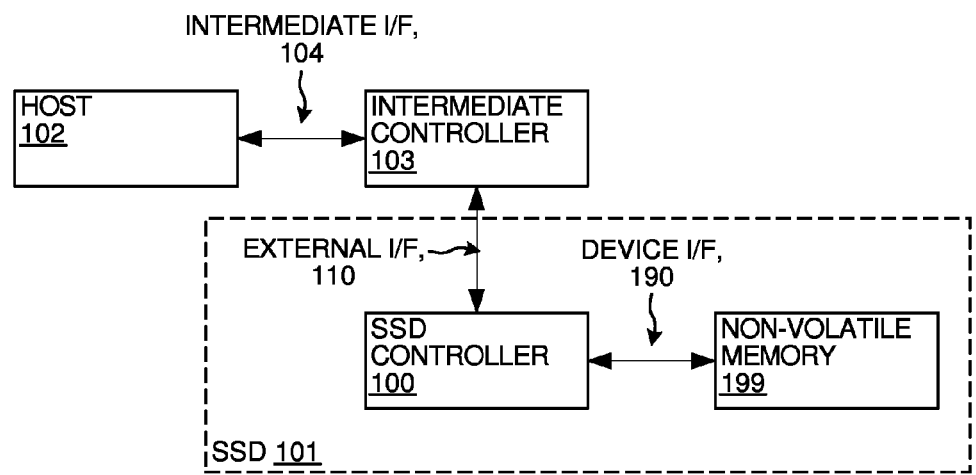
FIG. 1C illustrates selected details of an embodiment of a system including the SSD of FIG. 1A.

FIG. 1C illustrates selected details of an embodiment of a system including the SSD of FIG. 1A. As in FIG. 1B, SSD 101 includes SSD controller 100 coupled to non-volatile memory 199 via device interfaces 190. The SSD is coupled to host 102 via external interfaces 110 in turn coupled to intermediate controller 103 and then to host 102 via intermediate interfaces 104. In various embodiments, SSD controller 100 is coupled to the host via one or more intermediate levels of other controllers, such as a RAID controller.

In various embodiments, an SSD controller and/or a computing-host controller in combination with one or more non-volatile memories are implemented as a non-volatile storage component, such as a USB storage component, a CF storage component, an MMC storage component, an SD storage component, a Memory Stick storage component, and an xD-picture card storage component.

Mapping Operation

Figure 2:
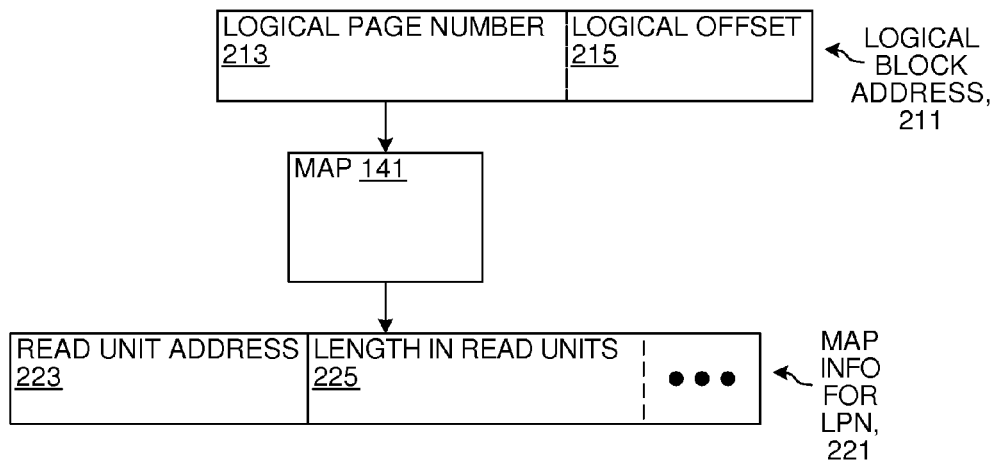
FIG. 2 illustrates selected details of an embodiment of mapping a Logical Page Number (LPN) portion of a Logical Block Address (LBA).

FIG. 2 illustrates selected details of an embodiment of mapping an LPN portion of a logical block address. In some embodiments, a read unit is a finest granularity of the non-volatile memory that is independently readable. In further embodiments, the read unit corresponds to check bits (sometimes-termed redundancy) of an error-correcting code along with all data protected by the check bits.

In some embodiments, map 141 maps LPN 213 to map info for LPN 221, such as via table 143 (as illustrated in FIG. 1A). Map info for an LPN (such as map info for LPN 221) is sometimes termed a map entry. Map 141 is said to associate (though mapping does not necessarily use an associative look-up) an LPN with a corresponding map entry.

In some embodiments, SSD controller 100 maintains one map entry for each LPN potentially and/or actively in use.

In some embodiments, map info for LPN 221 includes respective read unit address 223 and length in read units 225. In further embodiments, a first LPN is associated with a first map entry, a second LPN (different from the first LPN, but referring to a logical page of a same size as a logical page referred to by the first LPN) is associated with a second map entry, and the respective length in read units of the first map entry is different from the respective length in read units of the second map entry.

In various embodiments, at a same point in time, a first LPN is associated with a first map entry, a second LPN (different from the first LPN) is associated with a second map entry, and the respective read unit address of the first map entry is the same as the respective read unit address of the second map entry. In further embodiments, data associated with the first LPN and data associated with the second LPN are both stored in a same physical page of a same device in non-volatile memory 199.

According to various embodiments, read unit address 223 is associated with one or more of: a starting address in the non-volatile memory; an ending address in the non-volatile memory; an offset of any of the preceding; and any other techniques for identifying a portion of the non-volatile memory associated with LPN 213.

Figure 3:
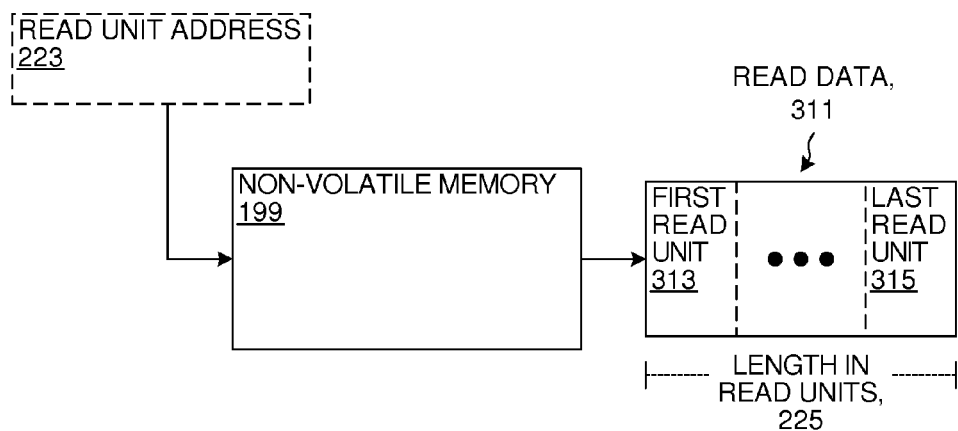
FIG. 3 illustrates selected details of an embodiment of accessing a non-volatile memory at a read unit address to produce read data organized as various read units, collectively having a length measured in quanta of read units.

FIG. 3 illustrates selected details of an embodiment of accessing a non-volatile memory at a read unit address to produce read data organized as various read units, collectively having a length measured in quanta of read units. According to various embodiments, first read unit 313 is one or more of: a one of read units in read data 311 with a lowest address in an address space of the non-volatile memory; a fixed one of the read units; an arbitrary one of the read units; a variable one of the read units; and any other technique for selecting one of the read units. In various embodiments, SSD controller 100 is enabled to access non-volatile memory 199 and produce read data 311 by reading no more than a number of read units specified by length in read units 225.

Figure 4:
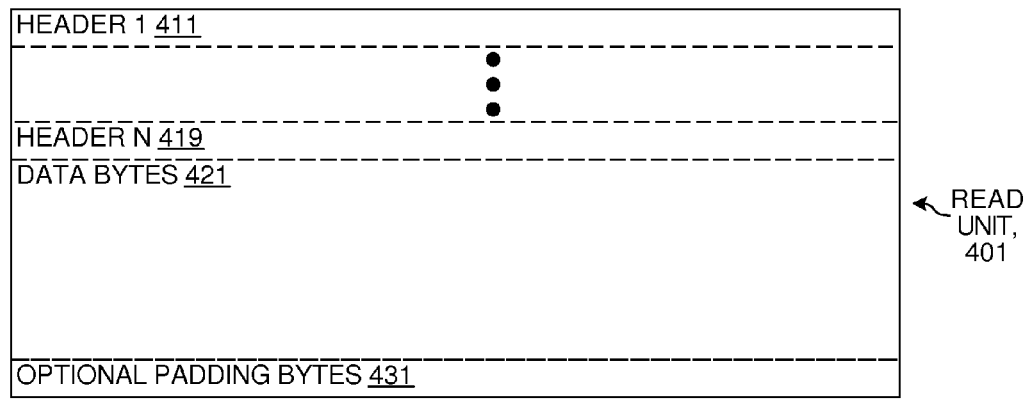
FIG. 4 illustrates selected details of an embodiment of a read unit.

FIG. 4 illustrates selected details of an embodiment of a read unit (such as read units 313 or 315 of FIG. 3). In various embodiments, header 1 411 through header N 419 are contiguous, and respective data regions identified (such as via respective offsets) by each of the headers are contiguous following a last one of the headers. The data regions collectively form data bytes 421. The data regions are stored in an order that matches the order the headers are stored. For example, consider a first header, at the beginning of a read unit, with a second header and a third header contiguously following the first header. A first data region (identified by a first offset in the first header) contiguously follows the third header. A second data region (identified by a second offset in the second header) contiguously follows the first data region. Similarly, a third data region (identified by the third header) contiguously follows the second data region.

In some embodiments, optional padding bytes 431 is according to granularity of data associated with a particular LPN. For example, in some embodiments, if data bytes 421 has less than a fixed amount of remaining space, such as 8 bytes, after storing data associated with all but a last one of header 1 411 through header N 419, then data for an LPN associated with the last header starts in a subsequent read unit. In further embodiments, a particular offset value (e.g. all ones) in the last header indicates that the data for the LPN associated with the last header starts in the subsequent read unit.

Figure 5:
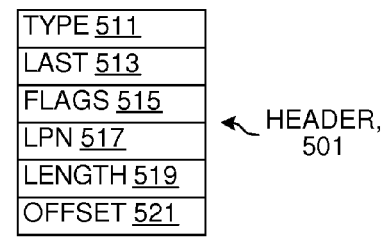
FIG. 5 illustrates selected details of an embodiment of a header having a number of fields.

FIG. 5 illustrates selected details of an embodiment of a header (such as any of header 1 411 through header N 419 of FIG. 4) having a number of fields. In some embodiments, headers are fixed-length (e.g. each header is a same number of bytes long). Header 501 includes fields type 511, last indicator 513, flags 515, LPN 517, length 519, and offset 521. The type field identifies a category of the data bytes. For example, the type field indicates the category of the data bytes is one of host data (e.g. logical page data) or system data (e.g. map data or checkpoint data). The last field indicates that the header is the last header before the data bytes. The LPN field is the LPN that the header is associated with. The LPN field enables parsing of the headers to determine a particular one of the headers that is associated with a particular LPN by, for example, searching the headers for one with an LPN field matching the particular LPN. The length field is the length, in bytes, of the data bytes (e.g. how many bytes of data there are in data bytes 421 associated with header 501). In some embodiments, an offset in the offset field is rounded according to a particular granularity (e.g. 8-byte granularity).

In various embodiments, some or all information associated with a particular LPN is stored in a map entry associated with the particular LPN, a header associated with the particular LPN, or both. For example, in some embodiments, some or all of length 519 is stored in a map entry rather than in a header.

Figure 6:
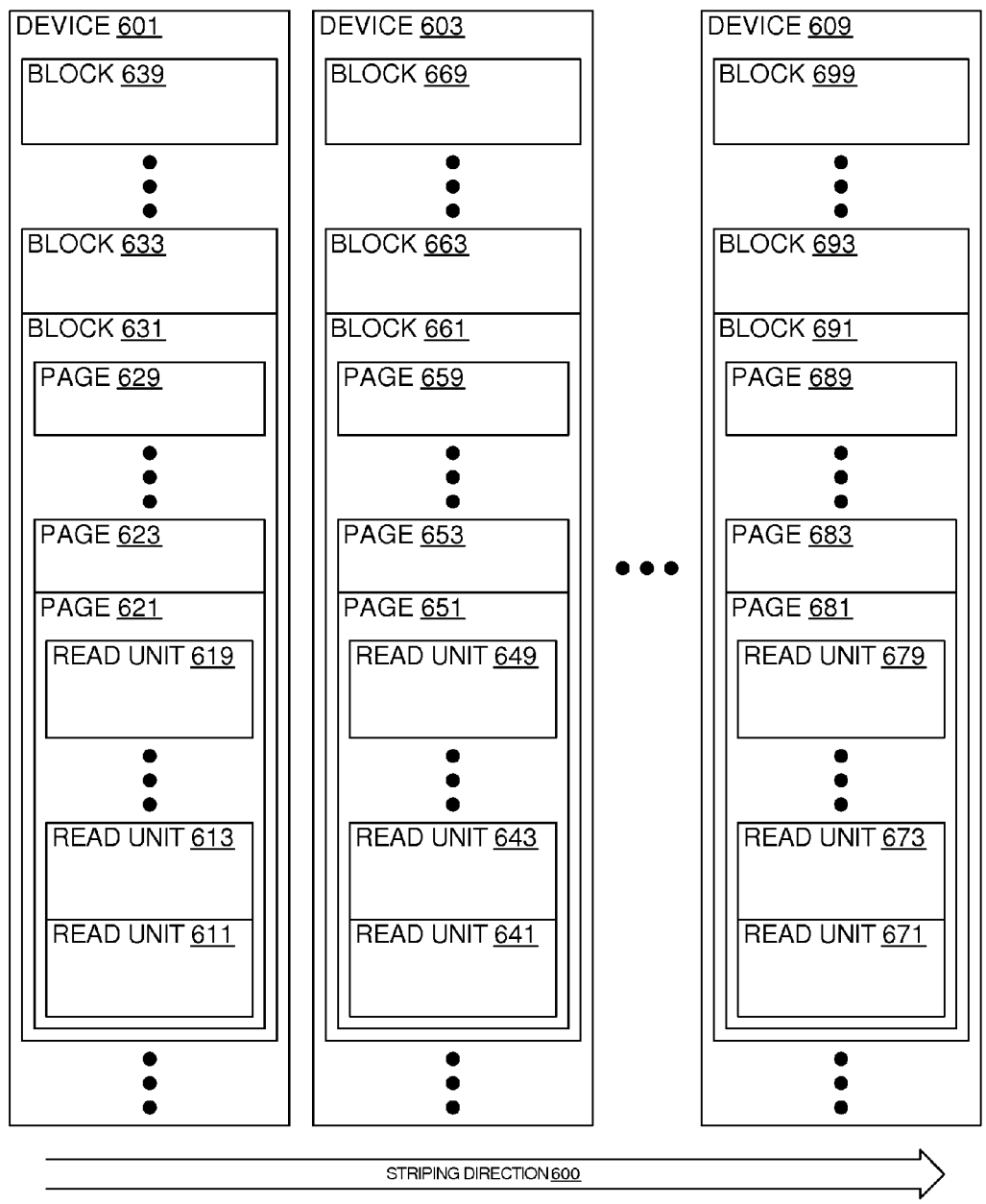
FIG. 6 illustrates selected details of an embodiment of blocks, pages, and read units of multiple non-volatile memory devices.

FIG. 6 illustrates selected details of an embodiment of blocks, pages, and read units of multiple non-volatile memory devices. For example, 601, 603, . . . , and 609 correspond to respective ones of one or more individual flash die 194, of FIG. 1A.

In some embodiments, devices 601, 603, . . . , and 609 are a portion less than all of non-volatile memory 199. For example, in various embodiments, data is striped independently across multiple groups of devices, where each of the groups of devices is independently accessible.

Each device (such as any one of devices 601, 603, . . . , and 609) provides storage organized as blocks (such as blocks 631, 633, . . . , and 639 of device 601; blocks 661, 663, . . . , and 669 of device 603; and so forth). The blocks in turn include pages (such as pages 621, 623, . . . , and 629 of block 631; pages 651, 653, . . . , and 659 of block 661; and so forth). The pages in turn include read units (such as read units 611, 613, . . . , and 619 of page 621; read units 641, 643, . . . , and 649 of page 651; and so forth). Reads and/or writes of information in the devices are performed according to an order, such as a 'read unit first' order or a 'page first' order. An example of a read unit first order for read units illustrated in the figure begins with read unit 611 followed by 641, . . . , 671, 613, 643, . . . , 673, and so forth, ending with 679. An example of a page first order for read units illustrated in the figure begins with read unit 611 followed by 613, . . . , 619, 641, 643, . . . , 649, 671, 673, and so forth, ending with 679.

Figure 7:
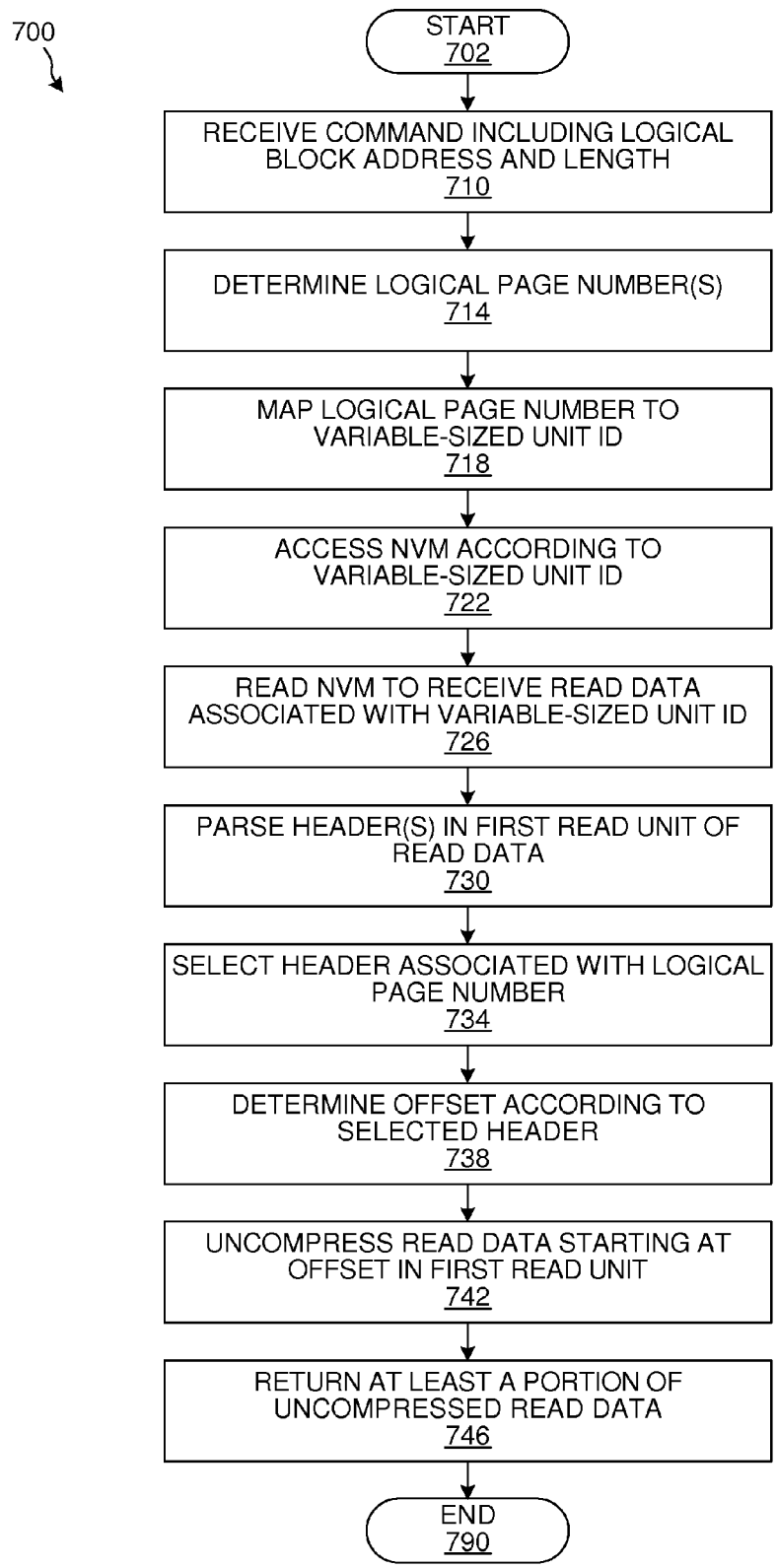
FIG. 7 illustrates selected details of an embodiment of an operation flow for reading a non-volatile memory.

FIG. 7 illustrates selected details of an embodiment of an operation flow for reading a non-volatile memory, such as all of any portion of one or more individual flash die 194 of FIG. 1A.

Figure 8A:
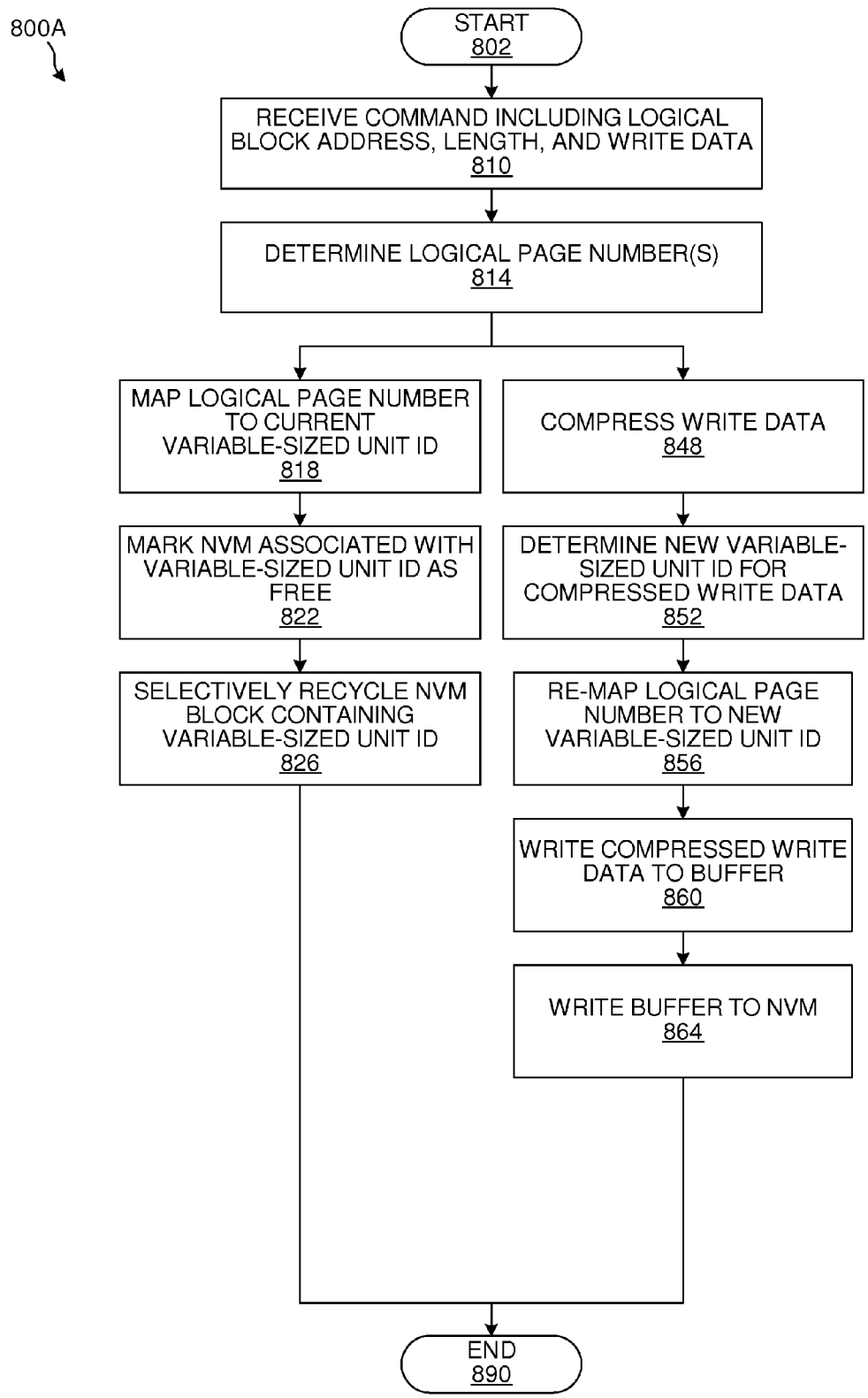
FIG. 8A illustrates selected details of an embodiment of an operation flow for writing a non-volatile memory.

FIG. 8A illustrates selected details of an embodiment of an operation flow for writing a non-volatile memory, such as all of any portion of one or more individual flash die 194 of FIG. 1A.

Power Failure and Recovery

In various embodiments, all or any portion of table 143 (of FIG. 1) and/or data contained therein is retained in volatile memory (e.g. storage that remains valid only with continuous application of power). After completing a write to flash memory of header(s) and associated data region(s), entries corresponding to the written header(s) and data region(s) are present in the table. Subsequently, the corresponding entries of the table are written to the flash memory (such as to a system portion of non-volatile memory 199). Periodically a checkpoint is written to the flash memory. The checkpoint includes a flush of buffered (but as yet) unwritten header (and data region) information (such as all or any portion of buffer 131), as well as table entries not otherwise previously written to the flash memory. If a power failure occurs in between the writing to the flash memory of the header(s) (and the associated data regions) and the corresponding entries of the table, then there is an inconsistency between header (and data region) and table entry information on the flash memory. When power returns, at system reset, and/or in response to a recovery/rebuild activity, data written to the flash memory after the most recent checkpoint is examined, and table 143 is updated with entries corresponding to header (and data region) information found.

In various embodiments, a power-loss detection circuit, a power-loss status detector, a power down command receiver/decoder, or any combination thereof are included in any convenient element of SSD controller 100, and provide a request to generate a checkpoint. For example, a power down command receiver/decoder is included in one or more external interfaces 110 and is enabled to receive and decode a power-down command from a computing and/or an interfacing host coupled to the external interfaces. In some embodiments, a super capacitor provides power when power is otherwise unavailable and a checkpoint is being written.

Write Coalescing

Figure 8B:
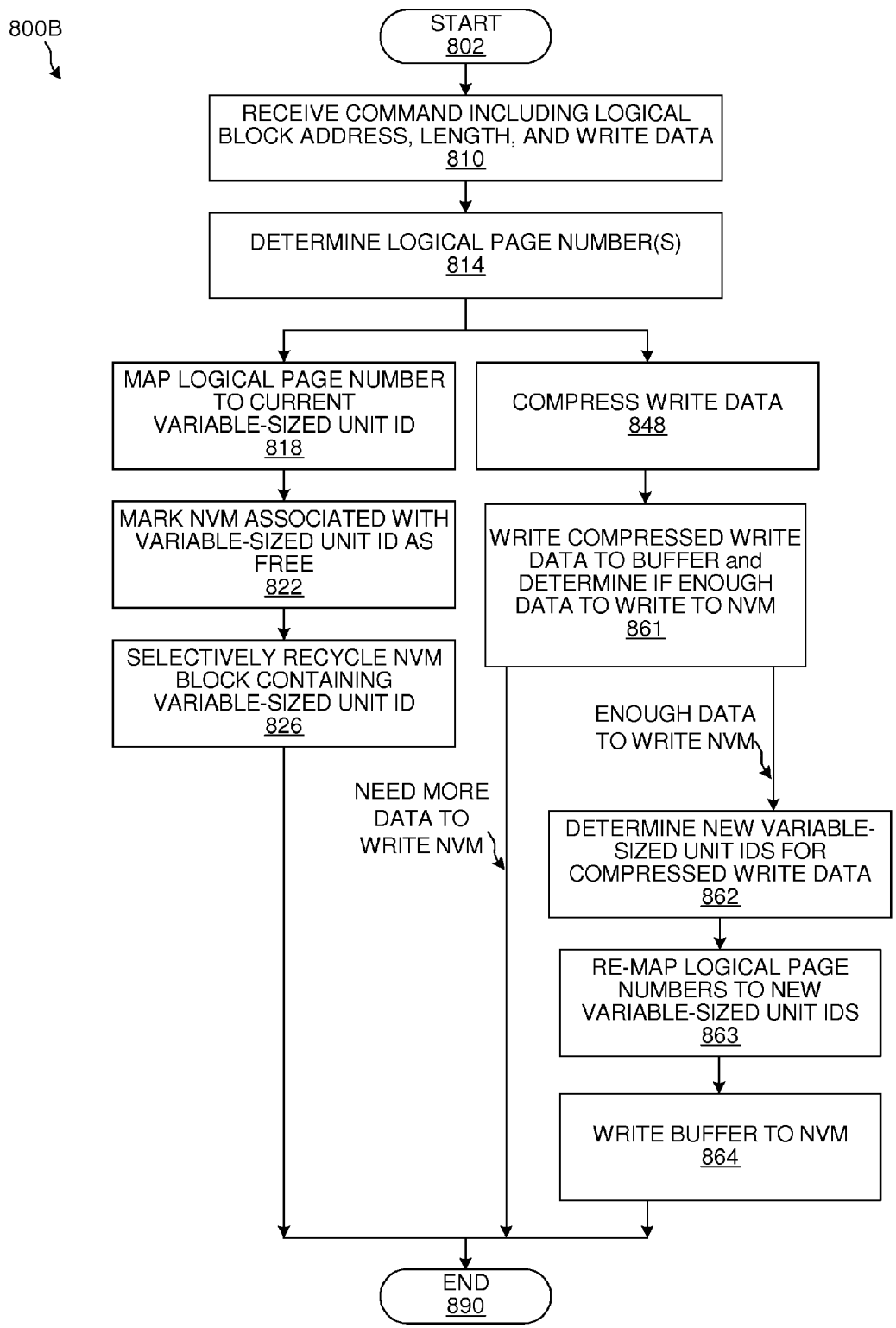
FIG. 8B illustrates selected details of an embodiment of an operation flow for writing a non-volatile memory, including write coalescing.

In some embodiments, an SSD controller provides a capability for coalescing a plurality of writes to non-volatile memory as a lesser number of writes. FIG. 8B illustrates selected details of an embodiment of an operation flow for writing a non-volatile memory, including write coalescing. Flow in FIG. 8B is similar to that of FIG. 8A. However, after compressing write data (see element 848) flow proceeds to element 861, where the compressed write data produced by element 848 is written to a buffer (such as to buffer 131 of FIG. 1). Element 861 determines if sufficient write data has been buffered to perform a write to non-volatile memory. If not, then processing is complete for the command and flow proceeds to element 890. If sufficient write data has been buffered to perform a write to non-volatile memory, then flow proceeds to element 862, where operations similar to those performed in element 852 of FIG. 8A for one logical page are performed for each of the logical pages that correspond to the buffered write data. Flow then proceeds to element 863, where operations similar to those performed in element 856 of FIG. 8A for one logical page are performed for each of the logical pages that correspond to the buffered write data. Flow then proceeds to element 864, and at least a portion of the buffered write data is written to the non-volatile memory. In various embodiments, the determination of whether sufficient write data has been buffered to perform a write to non-volatile memory is based on a comparison to a threshold (such as a threshold that is an integer multiple of a minimum flash write quanta, e.g. a page of flash memory).

Example Implementation Techniques

In some embodiments, various combinations of all or portions of operations performed by a computing-host flash memory controller or an SSD controller (such as SSD controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments some, all, or various portions of the program instructions are realized as one or more functions, routines, sub-routines, in-line routines, procedures, macros, or portions thereof.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
receiving, via a host interface, a Logical Block Address (LBA) from a host, the LBA specifying a Logical Page Number (LPN);
accessing one of a plurality of entries of a map associated with the LPN, each entry comprising a read unit address and a length in read units, the read unit address and the length identifying a portion of a non-volatile memory having a size corresponding to the length, and the entry being distinct from the non-volatile memory;
reading, via a memory interface, the portion of the non-volatile memory and obtaining an integer number of read units specified at least in part by the length, each of the integer number of read units comprising respective protected data bits and respective error-correcting code bits protecting the respective protected data bits;
performing error correction on each of one or more of the integer number of read units based at least in part on the respective error-correcting code bits and the respective protected data bits of the respective one or more of the integer number of read units to produce respective error-corrected read units;
parsing one or more headers in at least one of the error-corrected read units;
selecting a particular one of the headers associated with the LPN;
determining an offset in the at least one of the error-corrected read units based on information in the particular one of the headers associated with the LPN, wherein the information in the particular one of the headers comprises a particular host address associated with the LPN;
processing at least a portion of the error-corrected read units starting according to the offset in the at least one of the error-corrected read units to produce processed data; and
returning, via the host interface, at least a portion of the processed data in response to the receiving;
wherein the LBA is a first LBA, the LPN is a first LPN, the one of a plurality of entries of a map is a first map entry, and a second LBA specifies a second LPN that is different from the first LPN,
wherein the second LPN is associated with a second map entry,
wherein a read unit address of the first map entry is the same as a read unit address of the second map entry,
wherein a single reading of the portion of the non-volatile memory obtains data associated with the first LPN and data associated with the second LPN, and
wherein the accessing, the parsing, the selecting, the determining, and the processing are via a controller comprising the entry and coupled to the memory interface and the host interface, and the non-volatile memory, the controller, the memory interface, and the host interface are comprised in a storage device.

2. The method of claim 1, wherein the integer number of read units are less than all of a plurality of read units in one page of non-volatile memory.

3. The method of claim 1,
wherein the LBA is a first LBA; and
further obtaining data associated with a second LBA not equal to the first LBA from the reading of the portion of the non-volatile memory.

4. The method of claim 1,
wherein the LBA further specifies a logical offset; and
wherein the at least a portion of the processed data is a portion less than all of the processed data according to the logical offset.

5. The method of claim 1 wherein the processing comprises uncompressing, and the processed data comprises uncompressed data produced by the uncompressing.

6. The method of claim 5 wherein a data processing engine is enabled to perform the uncompressing, and the data processing engine is further enabled to perform decrypting.

7. The method of claim 1 wherein the host interface is compatible with a storage interface standard, and the storage interface standard comprises one or more of:
a Universal Serial Bus (USB) interface standard,
a Compact Flash (CF) interface standard,
a MultiMediaCard (MMC) interface standard,
a Secure Digital (SD) interface standard,
a Memory Stick interface standard,
an xD-picture card interface standard,
an Integrated Drive Electronics (IDE) interface standard,
a Serial Advanced Technology Attachment (SATA) interface standard,
an external SATA (eSATA) interface standard,
a Small Computer System Interface (SCSI) interface standard,
a Serial Attached Small Computer System Interface (SAS) interface standard,
a Fibre Channel interface standard,
an Ethernet interface standard, and
a Peripheral Component Interconnect express (PCIe) interface standard.

8. The method of claim 1,
wherein the LBA is specified by a command that is in accordance with one of a plurality of host-access-quanta;
wherein the determining of the offset is in accordance with any of the host-access-quanta; and
wherein the host-access-quanta comprise two or more of:
a 512-byte access quanta,
a 516-byte access quanta,
a 520-byte access quanta,
a 524-byte access quanta,
a 528-byte access quanta,
a 532-byte access quanta,
a 536-byte access quanta,
a 540-byte access quanta,
a 1024-byte access quanta,
a 1032-byte access quanta,
a 2048-byte access quanta,
a 2056-byte access quanta,
a 4096-byte access quanta,
a 4100-byte access quanta,
a 4104-byte access quanta,
a 4108-byte access quanta,
a 4112-byte access quanta,
a 4116-byte access quanta,
a 4160-byte access quanta,
a 4164-byte access quanta,
a 4172-byte access quanta,
a 4192-byte access quanta,
a 4196-byte access quanta, a 4204-byte access quanta,
a 4224-byte access quanta,
a 4228-byte access quanta,
a 4236-byte access quanta, and
a 4256-byte access quanta.

9. The method of claim 1, wherein at least some of the integer number of read units are in a first block in a first die of the non-volatile memory, and at least some others of the integer number of read units are in a second block in a second die of the non-volatile memory, the second die different from the first die.

10. The method of claim 1, further comprising:
compressing write data as compressed write data;
writing the compressed write data to a buffer; and
comparing the write data to a threshold to perform a write to non-volatile memory when it is determined that the threshold has been exceeded.

11. A system comprising:
a controller;
a memory interface enabled to interface with non-volatile memory;
a host interface;
wherein the controller is enabled to
receive, via the host interface, a Logical Block Address (LBA) from a host, the LBA specifying a Logical Page Number (LPN);
access one of a plurality of entries of a map associated with the LPN, each entry comprising a read unit address and a length in read units, the read unit address and the length identifying a portion of a non-volatile memory having a size corresponding to the length, and the entry being distinct from the non-volatile memory;
read, via a memory interface, the portion of the non-volatile memory and obtaining an integer number of read units specified at least in part by the length, each of the integer number of read units comprising respective protected data bits and respective error-correcting code bits protecting the respective protected data bits;
perform error correction on each of one or more of the integer number of read units based at least in part on the respective error-correcting code bits and the respective protected data bits of the respective one or more of the integer number of read units to produce respective error-corrected read units;
parse one or more headers in at least one of the error-corrected read units;
select a particular one of the headers associated with the LPN;
determine an offset in the at least one of the error-corrected read units based on information in the particular one of the headers associated with the LPN, wherein the information in the particular one of the headers comprises a particular host address associated with the LPN;
process at least a portion of the error-corrected read units starting according to the offset in the at least one of the error-corrected read units to produce processed data; and
return, via the host interface, at least a portion of the processed data in response to the receiving,
wherein the LBA is a first LBA, the LPN is a first LPN, the one of a plurality of entries of a map is a first map entry, and a second LBA specifies a second LPN that is different from the first LPN,
wherein the second LPN is associated with a second map entry,
wherein a read unit address of the first map entry is the same as a read unit address of the second map entry,
wherein a single reading of the portion of the non-volatile memory obtains data associated with the first LPN and data associated with the second LPN, and
wherein the non-volatile memory, the controller, the memory interface, and the host interface are comprised in a storage device.

12. The system of claim 11, wherein the integer number of read units are less than all of a plurality of read units in one page of non-volatile memory.

13. The system of claim 11,
wherein the LBA is a first LBA; and
wherein the controller further obtains data associated with a second LBA not equal to the first LBA from the reading of the portion of the non-volatile memory.

14. The system of claim 11,
wherein the LBA further specifies a logical offset; and
wherein the at least a portion of the processed data is a portion less than all of the processed data according to the logical offset.

15. The system of claim 11 wherein the controller comprises a data processing engine that is enabled to uncompress, and the processed data comprises uncompressed data produced by the data processing engine.

16. The system of claim 15 wherein the data processing engine is further enabled to perform decrypting.

17. The system of claim 11 wherein the host interface is compatible with a storage interface standard, and the storage interface standard comprises one or more of:
a Universal Serial Bus (USB) interface standard,
a Compact Flash (CF) interface standard,
a MultiMediaCard (MMC) interface standard,
a Secure Digital (SD) interface standard,
a Memory Stick interface standard,
an xD-picture card interface standard,
an Integrated Drive Electronics (IDE) interface standard,
a Serial Advanced Technology Attachment (SATA) interface standard,
an external SATA (eSATA) interface standard,
a Small Computer System Interface (SCSI) interface standard,
a Serial Attached Small Computer System Interface (SAS) interface standard,
a Fibre Channel interface standard,
an Ethernet interface standard, and
a Peripheral Component Interconnect express (PCIe) interface standard.

18. The system of claim 11,
wherein the LBA is specified by a command that is in accordance with one of a plurality of host-access-quanta;
wherein the determining of the offset is in accordance with any of the host-access-quanta; and
wherein the host-access-quanta comprise two or more of:
a 512-byte access quanta,
a 516-byte access quanta,
a 520-byte access quanta,
a 524-byte access quanta,
a 528-byte access quanta,
a 532-byte access quanta,
a 536-byte access quanta,
a 540-byte access quanta,
a 1024-byte access quanta,
a 1032-byte access quanta,
a 2048-byte access quanta,
a 2056-byte access quanta,
a 4096-byte access quanta,
a 4100-byte access quanta, a 4104-byte access quanta,
a 4108-byte access quanta,
a 4112-byte access quanta,
a 4116-byte access quanta,
a 4160-byte access quanta,
a 4164-byte access quanta,
a 4172-byte access quanta,
a 4192-byte access quanta,
a 4196-byte access quanta,
a 4204-byte access quanta,
a 4224-byte access quanta,
a 4228-byte access quanta,
a 4236-byte access quanta, and
a 4256-byte access quanta.

19. The system of claim 11, wherein at least some of the integer number of read units are in a first block in a first die of the non-volatile memory, and at least some others of the integer number of read units are in a second block in a second die of the non-volatile memory, the second die different from the first die.

20. A non-transitory computer readable storage medium having a set of instructions stored therein that when executed by a processing element cause the processing element to perform operations comprising:
managing receiving, via a host interface, a Logical Block Address (LBA) from a host, the LBA specifying a Logical Page Number (LPN);
managing accessing one of a plurality of entries of a map associated with the LPN, each entry comprising a read unit address and a length in read units, the read unit address and the length identifying a portion of a non-volatile memory having a size corresponding to the length, and the entry being distinct from the non-volatile memory;
managing reading, via a memory interface, the portion of the non-volatile memory and obtaining an integer number of read units specified at least in part by the length, each of the integer number of read units comprising respective protected data bits and respective error-correcting code bits protecting the respective protected data bits;
managing performing error correction on each of one or more of the integer number of read units based at least in part on the respective error-correcting code bits and the respective protected data bits of the respective one or more of the integer number of read units to produce respective error-corrected read units;
managing parsing one or more headers in at least one of the error-corrected read units;
managing selecting a particular one of the headers associated with the LPN;
managing determining an offset in the at least one of the error-corrected read units based on information in the particular one of the headers associated with the LPN, wherein the information in the particular one of the headers comprises a particular host address associated with the LPN;
managing processing at least a portion of the error-corrected read units starting according to the offset in the at least one of the error-corrected read units to produce processed data; and
managing returning, via the host interface, at least a portion of the processed data in response to the receiving,
wherein the LBA is a first LBA, the LPN is a first LPN, the one of a plurality of entries of a map is a first map entry, and a second LBA specifies a second LPN that is different from the first LPN,
wherein the second LPN is associated with a second map entry,
wherein a read unit address of the first map entry is the same as a read unit address of the second map entry,
wherein a single reading of the portion of the non-volatile memory obtains data associated with the first LPN and data associated with the second LPN, and
wherein the accessing, the parsing, the selecting, the determining, and the processing are via a controller comprising the entry and coupled to the memory interface and the host interface, and the non-volatile memory, the controller, the memory interface, and the host interface are comprised in a storage device.

21. The non-transitory computer readable storage medium of claim 20, wherein the integer number of read units are less than all of a plurality of read units in one page of non-volatile memory.

22. The non-transitory computer readable storage medium of claim 20,
wherein the LBA is a first LBA; and
wherein the managing reading further obtains data associated with a second LBA not equal to the first LBA from the reading of the portion of the non-volatile memory.

23. The non-transitory computer readable storage medium of claim 20,
wherein the LBA further specifies a logical offset; and
wherein the at least a portion of the processed data is a portion less than all of the processed data according to the logical offset.

24. The non-transitory computer readable storage medium of claim 20 wherein the processing comprises uncompressing, and the processed data comprises uncompressed data produced by the uncompressing.

25. The non-transitory computer readable storage medium of claim 24 wherein a data processing engine is enabled to perform the uncompressing, and the data processing engine is further enabled to perform decrypting.

26. The non-transitory computer readable storage medium of claim 20, wherein at least some of the integer number of read units are in a first block in a first die of the non-volatile memory, and at least some others of the integer number of read units are in a second block in a second die of the non-volatile memory, the second die different from the first die.

* * * * *